(12) United States Patent
Barr et al.

(10) Patent No.: US 6,919,813 B2
(45) Date of Patent: Jul. 19, 2005

(54) BUILT-IN CIRCUITRY AND METHOD TO TEST CONNECTOR LOADING

(75) Inventors: Andrew Harvey Barr, Roseville, CA (US); Dale John Shidla, Roseville, CA (US); Ken Gary Pomaranski, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 10/439,553

(22) Filed: May 16, 2003

(65) Prior Publication Data
US 2004/0227637 A1 Nov. 18, 2004

(51) Int. Cl.[7] ............................................. G08B 21/00
(52) U.S. Cl. ..................... 340/687; 340/635; 340/653; 340/500; 340/540
(58) Field of Search ............................. 340/687, 691.1, 340/635, 500, 653, 657, 540, 686; 324/158.1, 760, 765, 414, 768, 769, 508, 509, 510; 361/724, 683, 684, 801

(56) References Cited

U.S. PATENT DOCUMENTS

| | | | | |
|---|---|---|---|---|
| 3,870,953 A | * | 3/1975 | Boatman et al. | 324/72.5 |
| 5,459,396 A | * | 10/1995 | Asar | 324/158.1 |
| 5,795,172 A | * | 8/1998 | Shahriari et al. | 439/260 |
| 6,327,150 B1 | * | 12/2001 | Levy et al. | 361/724 |
| 6,445,188 B1 | | 9/2002 | Lutz et al. | |
| 6,462,570 B1 | * | 10/2002 | Price et al. | 324/754 |
| 6,517,369 B1 | | 2/2003 | Butterbaugh et al. | |

* cited by examiner

Primary Examiner—Hung Nguyen

(57) ABSTRACT

One embodiment disclosed relates to a printed circuit board (PCB) with built-in circuitry to test connector loading. The PCB includes at least the connector to be tested, an indicator circuit, and a switch. The connector is configured to interconnect to a card. The switch couples the connector to the indicator circuit, and integrity of the interconnection between the card and the connector is indicated by the indicator circuit.

21 Claims, 7 Drawing Sheets

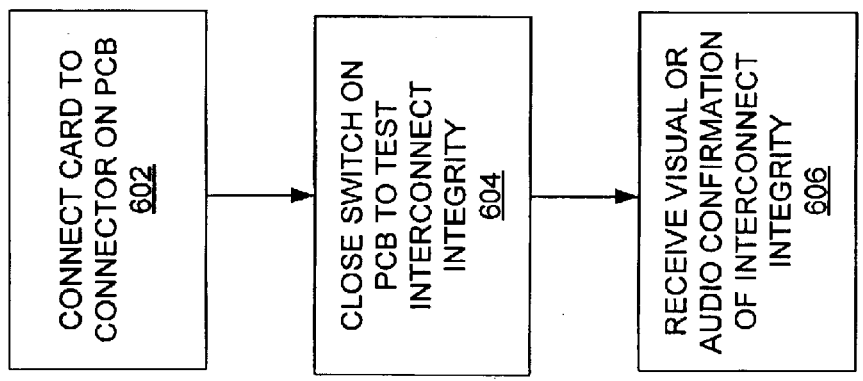

BUILT-IN CIRCUITRY AND METHOD TO TEST CONNECTOR LOADING

BACKGROUND OF THE INVENTION

1. Field of the Invention

The present invention relates generally to electronics and computers.

2. Description of the Background Art

Interconnects of various kinds pose a significant failure mechanism for computer servers. A typical failure mode for interconnects is for a loss of continuity (an open circuit) to occur due to mechanical stress, vibrations, shock, contaminant build-up, poor assembly, and other reasons. This loss of continuity can cause system failures, which are difficult and costly to debug. In addition, no simple, efficient method currently exists to determine the seating (i.e., connection integrity) of an interconnect prior to system assembly and test.

One prior solution to determine the status of an interconnect is to perform continuity checks of an interconnect by hand with an ohm (resistance) meter. This technique is inefficient, time consuming, requires additional test hardware, and is difficult to accurately and quickly perform.

Another prior solution is to perform automatic testing using a bed-of-nails test fixture. Such testing is practical for printed-circuit assemblies having only one layer and with test pads built into the boards. Probes from the bed-of-nails fixture would make contact with the test pads, and tests could be run to locate interconnect defects, such as opens or shorts. However, this technique has become impractical as electronic systems became smaller, wires on the board became denser, devices became placed on both sides of a board, and so on. In addition, bed of nails testers typically test a single non-mated board, not an interconnection between a mated pair of boards. Also bed of nails testing requires a large test fixture and is typically only done for first board build, or if a board is removed from the system and sent back for debug.

Another prior solution is to run boundary-scan (SCAN) testing. This type of testing requires special software and training and typically cannot be performed until the system is assembled and powered on.

The above-described problems and disadvantages may be overcome by utilizing embodiments of the present invention.

SUMMARY

One embodiment of the invention pertains to a printed circuit board (PCB) with built-in circuitry to test connector loading. The PCB includes at least the connector to be tested, an indicator circuit, and a switch. The connector is configured to interconnect to a card. The switch couples the connector to the indicator circuit, and integrity of the interconnection between the card and the connector is indicated by the indicator circuit.

Another embodiment of the invention pertains to a method of manufacturing an electronic or computer system including at least a printed circuit board (PCB), and a card to be connected to the PCB. The method includes at least: interconnecting the card and a connector on the PCB; closing a switch on the PCB to test interconnect integrity between the card and the connector; and receiving visual or audio confirmation when the interconnect integrity is verified. Said testing occurs without power being applied to the system.

BRIEF DESCRIPTION OF THE DRAWINGS

FIG. 6 is a flow chart depicting steps in a method of manufacturing an electronic or computer system in accordance with an embodiment of the invention.

DETAILED DESCRIPTION

Figure 1:
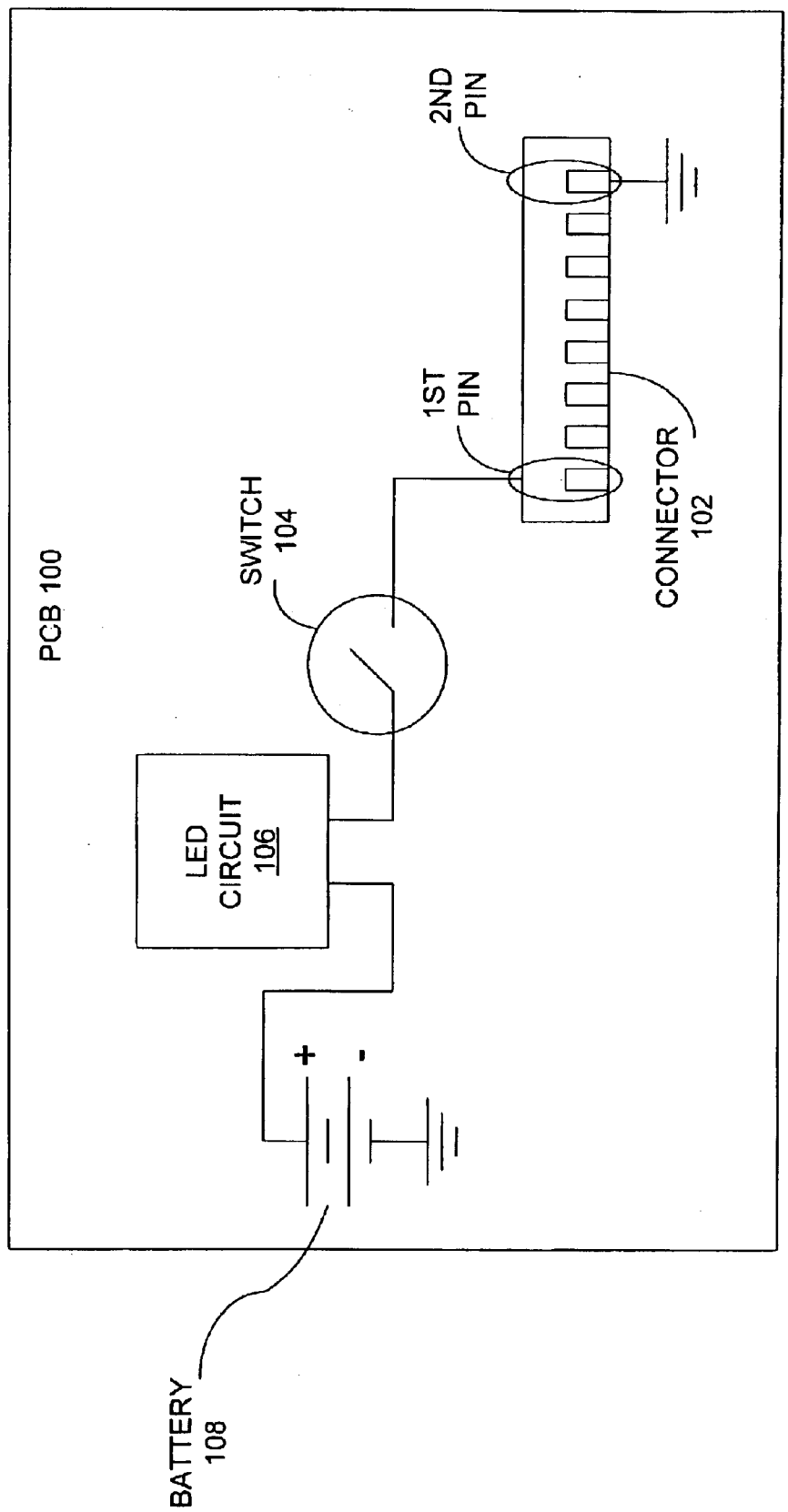
FIG. 1 is a schematic diagram depicting circuitry on a printed circuit board (PCB) in accordance with an embodiment of the invention.

FIG. 1 is a schematic diagram depicting circuitry on a printed circuit board (PCB) 100 in accordance with an embodiment of the invention. In a preferred example, the PCB 100 may comprise a motherboard for a computer server. Alternatively, the PCB 100 may comprise a motherboard for a personal computer, or a board used for an electronic system.

The components of the circuitry include a connector 102, a switch 104, a light emitting diode (LED) circuit 106, and a battery 108. In addition to the depicted circuitry, there is of course other circuitry (not shown) on the PCB 100 to perform functions other than continuity verification.

The connector may comprise an interconnect of various kinds, such as, for example, a PCB-to-PCB connector. For instance, the connector may connect a daughter board (daughter card) to a mother board. The daughter board may comprise a memory module, an input/output (I/O) board, or a processor board.

The connector may comprise, for example, a slot for a printed edge connector. Other types of connectors may also be utilized. In some embodiments, the card may be connected via a cable to the connector. The connector is illustrated as having eight conductive "pins" for connecting to a card, but the number of pins will vary depending on the actual type of connector. One particular example of a connector would be a connector for a dual in-line memory module (DIMM).

In this embodiment, two pins on the connector 102 are specifically designated for use in verification of proper card seating. A first designated pin of the connector 102 is conductively connected to the switch 104. A second designated pin of the connector 102 is electrically grounded. In a preferred embodiment, these first and second pins may be on or towards opposite ends of the connector 102. By configuring the first and second pins towards opposite ends, mis-seating of a card in the connector 104 may be efficiently determined.

The switch 104 conductively connects the first pin to the LED circuit 106. For example, the switch 104 may comprise a button type switch or another type of electrical switch that may be manually operated.

The LED circuit connects the switch 104 to the battery 108. The LED circuit 106 may comprise one of various LED devices that are commercially available. The LED includes a semiconductor device that emits visible light when an electric current passes through it. LEDs operate at relatively low voltages typically between about 1 and 4 volts, and draw currents typically between about 10 and 40 milliamperes. An LED used as a visual indication is just one embodiment. Other embodiments may utilize other types of indications. For example, an audio indication in the form of a "beep" may be used as an indication of the connection status.

The battery 108 provides power sufficient to operate the LED. By including a battery on the PCB 100 to power the circuitry shown in FIG. 1, the integrity of the loading of the connector 102 may be tested without power being applied to the PCB 100 and prior to full assembly of the system.

In addition, the PCB 100 may also include a second indication (not illustrated) to test the functioning of the battery to reduce the appearance of false failures. This indication of battery function may comprise, for example, another switch and LED circuit to give a visual indication that the battery is good and thus the test of the interconnect is valid. The indication of battery function may be implemented in other ways, such as by an audio indication. It is also possible to integrate the indications of interconnect continuity and battery function in the same indication circuitry, such that, for example, a flashing LED indicates battery functioning and interconnect failure, while a solid, lighted LED indicates battery functioning and interconnect continuity.

Figure 2:
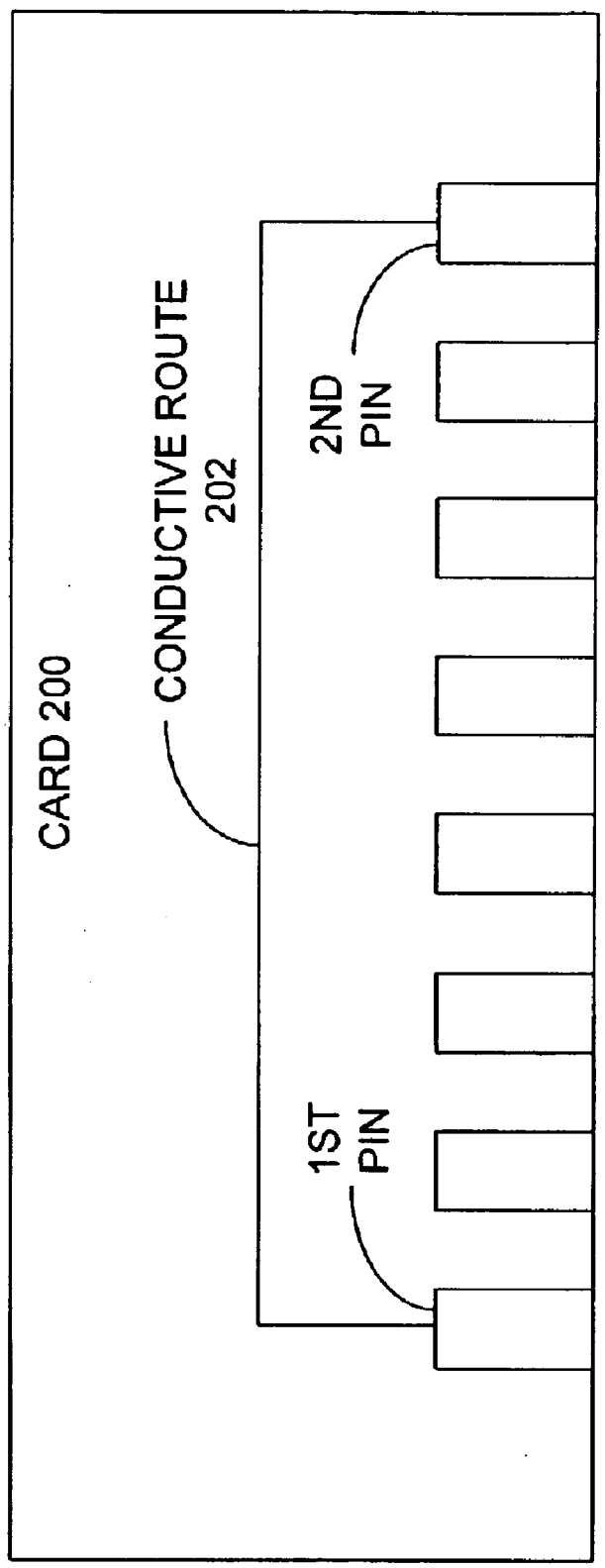
FIG. 2 is a schematic diagram depicting circuitry on a card to be connected to the PCB of FIG. 1.

FIG. 2 is a schematic diagram depicting circuitry on a card 200 to be connected to the PCB 100 of FIG. 1. The card 200 includes conductive pads (pins) that correspond to the pins on the PCB 100 for connecting thereto. In particular, there are a first pin and a second pin on the card 200 that correspond to the first and second designated pins on the PCB 100. In addition to other circuitry (not shown) on the card 200, there is a conductive route or signal trace 202 on the card 200 between the first pin and the second pin. This conductive route 202 enables the verification of proper loading of the card 200 into the connector 102.

The PCB 100 of FIG. 1 and the card 200 of FIG. 2 operate together as follows. When the switch 104 is open, there is an open circuit and no current flows through the LED 106. When the switch 104 is closed, then whether or not current flows through the LED 106 depends on whether or not the card is properly seated in the connector 102. If the card 200 is properly seated in the connector 102, then there will be a conductive path from the switch 104 (through the first pin, the conductive route 202, and the second pin) to electrical ground. If the card 200 is not properly seated in the connector 102, then there would be an open circuit such that the connector-side of the switch 104 would be left floating. This open circuit would be caused by a lack of electrical connection between the PCB 100 and the card 200 at either the first pin location, or the second pin location, or both.

Figure 3:
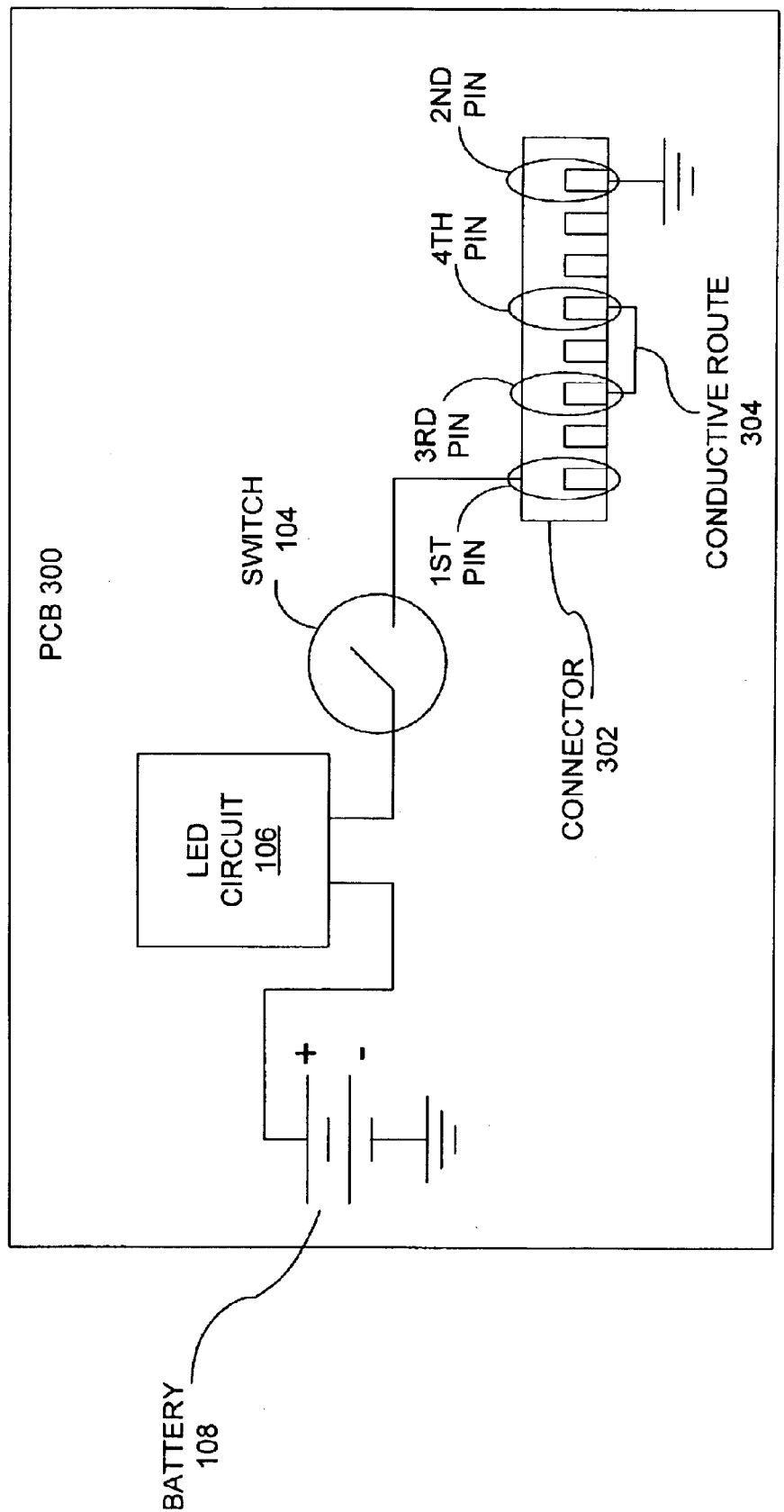
FIG. 3 is a schematic diagram depicting circuitry on a PCB in accordance with another embodiment of the invention.

FIG. 3 is a schematic diagram depicting circuitry on a PCB 300 in accordance with another embodiment of the invention. The circuitry of FIG. 3 includes the components and connections of the circuitry of FIG. 1. In addition, the circuitry of FIG. 3 includes two more specially designated pins of the connector 302 to further enhance the verification of proper card seating. These two additional pins comprise a third designated pin and a fourth designated pin. These two pins may be located at distributed points along the connector 302 to further detect mis-seating of a card 400 therein. Furthermore, the PCB 300 includes conductive routing (i.e. a signal trace) 304 to electrically connect the third and fourth pins together.

Figure 4:
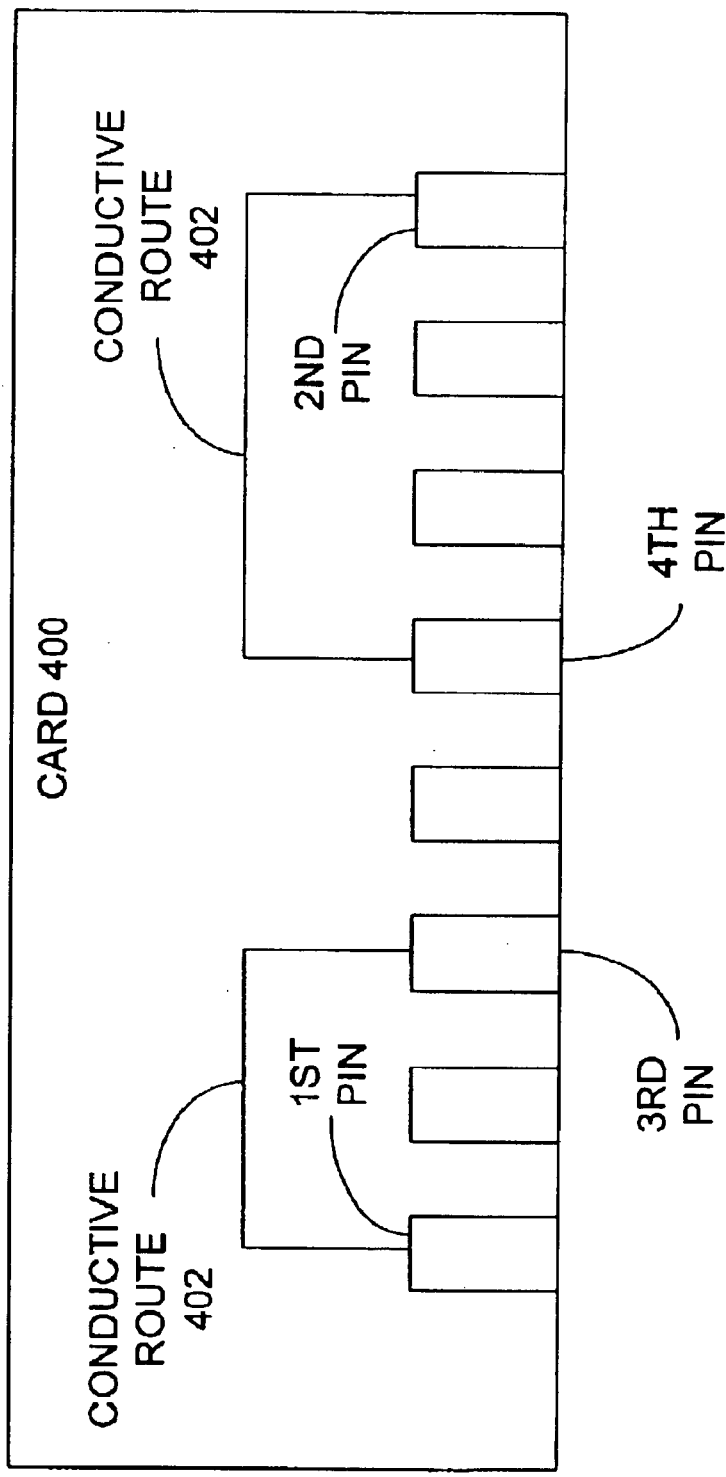
FIG. 4 is a schematic diagram depicting circuitry on a card to be connected to the PCB of FIG. 3.

FIG. 4 is a schematic diagram depicting circuitry on a card 400 to be connected to the PCB 300 of FIG. 3. The card 400 includes conductive pads (pins) that correspond to the pins on the PCB 300 for connecting thereto. In particular, there are first, second, third and fourth designated pins on the card 400 that correspond to the first, second, third and fourth designated pins on the PCB 300. In addition to other circuitry (not shown) on the card 400, there is a first conductive route (signal trace) 402 on the card 400 between the first pin and the third pin, and there is a second conductive route (signal trace) 404 between the fourth pin and the second pin. These conductive routes 402 and 404 enable the verification of proper loading of the card 400 into the connector 302.

The PCB 300 of FIG. 3 and the card 400 of FIG. 4 operate together as follows. When the switch 104 is open, there is an open circuit and no current flows through the LED 106. When the switch 104 is closed, then whether or not current flows through the LED 106 depends on whether or not the card 400 is properly seated in the connector 302. If the card 400 is properly seated in the connector 102, then there will be a conductive path from the switch 104 (through the first pin, the first conductive route 402 on the card, the third pin, the conductive route 304 on the PCB, the fourth pin, the second conductive route 404 on the card, and the second pin) to electrical ground. If the card 400 is not properly seated in the connector 302, then there would be an open circuit such that the connector-side of the switch 104 would be left floating. This open circuit would be caused by a lack of electrical connection between the PCB 300 and the card 400 at one or more of the four designated pins.

Figure 5A:
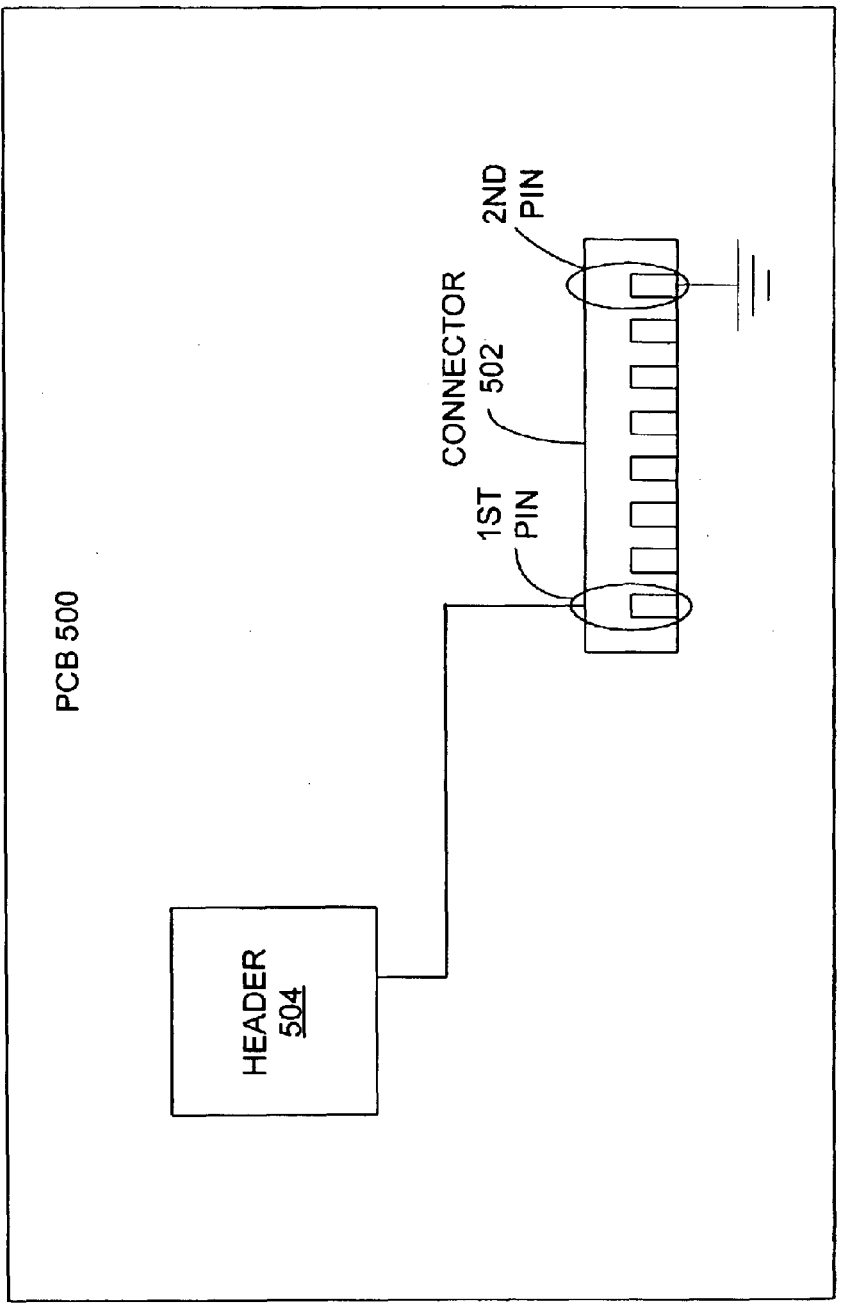
FIG. 5A is a schematic diagram depicting circuitry on a PCB in accordance with another embodiment of the invention.

FIG. 5A is a schematic diagram depicting circuitry on a PCB 500 in accordance with another embodiment of the invention. The circuitry includes a connector 502.

In the illustrated example, the connector 502 is configured similarly as the connector 102 of FIG. 1 in that the connector 502 has two pins designated for purposes of testing connector loading. A first designated pin of the connector 502 is conductively connected to a header 504 on the PCB 500, and a second designated pin of the connector 500 is conductively connected to electrical ground. With this configuration, the connector 502 operates in cooperation with a card 200 configured as in FIG. 2. Alternatively, the connector 502 may be configured similarly as the connector 302 of FIG. 3 and have four pins designated to test connector loading. In that case, the connector 502 would operate in cooperation with a card 400 configured as in FIG. 4.

The header 504 is a device that may be readily utilized to form a temporary electrical connection. In particular, the header 504 is used to connect to the indicator device 505 described below.

Figure 5B:
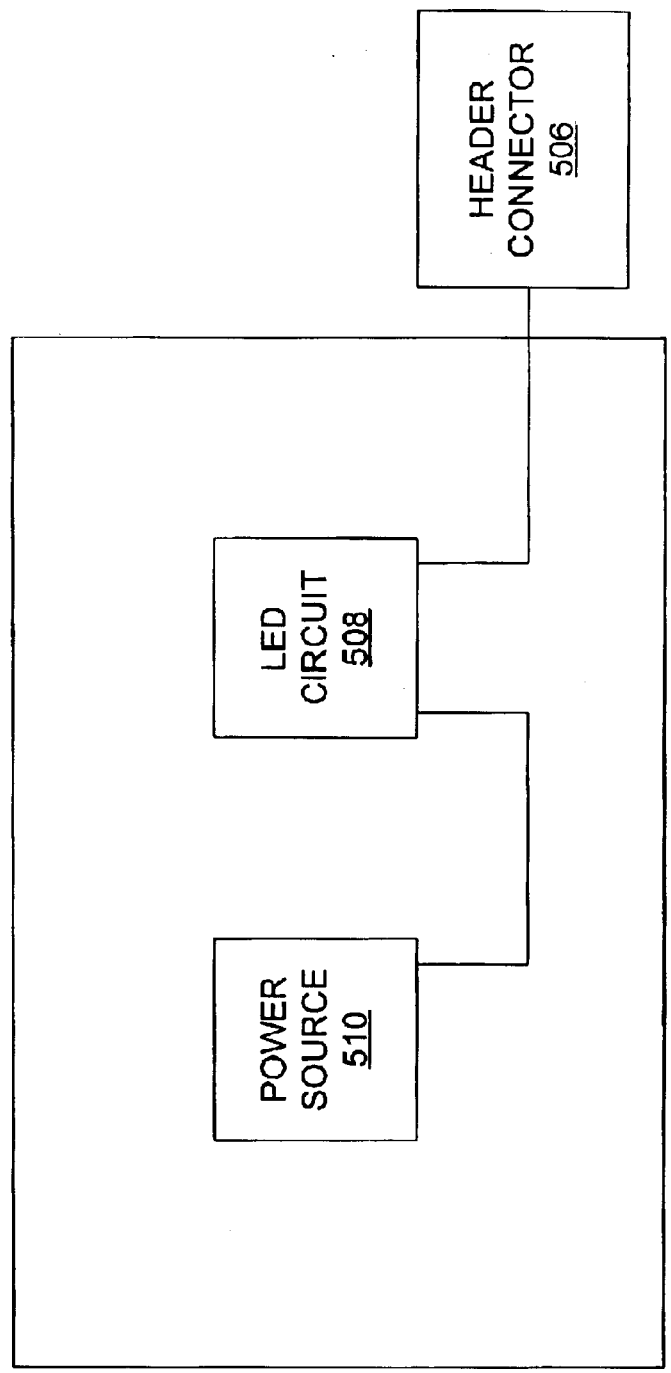
FIG. 5B is a schematic diagram depicting an indicator device to be used in cooperation with the PCB of FIG. 5A.

FIG. 5B is a schematic diagram depicting an indicator device to be used in cooperation with the PCB 500 of FIG. 5A. The indicator device 505 includes a header connector 506, an LED circuit 508, and a power source 510.

The header connector 506 comprises a mate to the header 504 on the PCB 500. By connecting the header connector 506 to the header 504, an electrical connection is made between the first designated pin of the connector 502 on the PCB 500 and the LED circuit 508 on the indicator device 505. The power source 510 provides power sufficient to operate the LED. In one embodiment, the power supply 510 may comprise a battery. Alternatively, the power source 510 may comprise an AC-DC power converter that is coupled to an AC power source.

By using the indicator device 505 with its own power source 510, the integrity of the loading of the connector 502 may be tested without power being applied to the PCB 500 and prior to full assembly of the system.

FIG. 6 is a flow chart depicting steps in a method 600 of manufacturing an electronic or computer system in accordance with an embodiment of the invention. The system being manufactured includes at least a printed circuit board (PCB) and a card to be connected to the PCB.

As part of the assembly of the system, a card is inserted into or otherwise connected to 602 the connector on the PCB. Subsequently, to test the interconnect integrity between the card and the connector, a switch on the PCB is closed 604. Visual confirmation in the form of a light indication is received 606 when the integrity of the interconnect is confirmed. Alternatively, audio confirmation may be received, for example, with a "beep." Advantageously, the testing (steps 604 and 606 of this method 600) occurs without power being applied to the system. The testing may occur prior to final assembly of the system. Alternatively, the testing may easily be performed in the field by a technician or even by the end user.

The invented method 600 of FIG. 6 has further advantages over prior techniques. Compared with performing continuity checks by hand, the method 600 may be performed quickly and accurately using the built-in circuitry on the PCB. Compared with performing automatic testing using a bed-of-nails test fixture, the invented method 600 does not require expensive equipment and is applicable to an assembly where the card is perpendicular or substantially non-parallel to the PCB. The bed-of-nails test fixture cannot be applied to such a perpendicular or substantially non-parallel configuration of boards. With the invention, we can test a mated pair of boards during board assembly, system assembly, or in the field. Further, this invention does not require a large test fixture. Compared with performing boundary-scan testing, the invented method 600 does not require special software and training.

While the above description includes details on embodiments that have two or four designated pins for use in testing connector loading, other embodiments can have different numbers of such designated pins. For example, three designated pins may be used, where a first pin is connected to a switch (or header), a second pin is grounded, and a third pin is connected to the first pin via a signal trace on the board and is connected to the second pin via a signal trace on the card (or vice-versa). Any number of pins in series may be used with a greater number of pins used for greater coverage at a greater cost of density of signals.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A computer system with built-in circuitry to self-test proper seating of a daughter card within the computer system, the computer system comprising:

a motherboard of the computer system;

a slot connector on the motherboard configured to interconnect to the daughter card;

an indicator circuit on the motherboard for indicating connection integrity between the daughter card and the slot connector; and a switch on the motherboard coupling the indicator circuit to the slot connector.

2. The computer system of claim 1, wherein the indicator circuit generates a light indication.

3. The computer system of claim 1, wherein the indicator circuit generates an audio indication.

4. The computer system of claim 2, wherein the indicator circuit comprises a light emitting diode (LED).

5. The computer system of claim 1, further comprising a battery coupled to the indicator circuit.

6. The computer system of claim 1, further comprising:

a first pin of the connector which is coupled to the switch; and a second pin of the connector which is set to a fixed voltage level, wherein the daughter card is configured to include a conductive route for electrically connecting the first and second pins.

7. The computer system of claim 6, wherein the first and second pins are located towards opposite ends of the connector.

8. The computer system of claim 1, wherein the computer system comprises a computer server.

9. The computer system of claim 1, wherein the computer system comprises a personal computer.

10. The computer system of claim 1, wherein the daughter card comprises a memory module.

11. The computer system of claim 1, wherein the daughter card comprises an input/output card.

12. The computer system of claim 1, wherein the daughter card comprises a processor card.

13. A printed circuit board (PCB) with built-in circuitry to test connector loading, the PCB comprising:

a connector configured to interconnect to a card;

an indicator circuit for indicating connection integrity between the card and the connector;

a switch coupling the indicator circuit to the connector;

a first pin of the connector which is coupled to the switch;

a second pin of the connector which is set to a fixed voltage level;

a third pin of the connector;

a fourth pin of the connector; and a first signal trace for electrically connecting the third and fourth pins, wherein the card includes a second signal trace for electrically connecting the first and third pins when the card is properly seated in the connector, and wherein the card includes a third signal trace for electrically connecting the fourth and second pins when the card is properly seated in the connector.

14. The PCB of claim 13, wherein two of said four pins are located towards opposite ends of the connector, and remaining of said four pins are towards a middle of the connector.

15. A motherboard for a consumer electronics product with circuitry built-in to verify proper loading of a slot connector thereon prior to powering and/or complete assembly of the consumer electronic product, the motherboard comprising:

a header on the motherboard for temporarily electrically coupling to an indicator circuit;

a first designated pin of the slot connector which is electrically connected to the header; and a second designated pin of the slot connector which is set to a fixed voltage level.

16. A system comprising the motherboard of claim 15 and further comprising:

a card configured to be seated in the slot connector on the motherboard;

wherein the card includes a conductive route on the card to electrically connect the first and second designated pins when the card is properly seated in the slot connector.

17. The system of claim 16, further comprising:

a separate device that includes the indicator circuit and further includes:

a power source configured for powering the indicator circuit; and a mechanism to physically connect to the header on the motherboard so that the indicator circuit is electrically connected to the first pin of the slot connector.

18. A method of manufacturing an electronic or computer system including at least a motherboard and a daughter card to be seated in a slot connector on the motherboard, the method comprising:

interconnecting the daughter card and the slot connector on the motherboard;

closing a switch on the motherboard to test interconnect integrity between the daughter card and the slot connector; and receiving confirmation in form of a visual or audio indication when the interconnect integrity is verified, wherein said testing occurs without power being applied to the system.

19. The method of claim 18, wherein said testing occurs prior to final assembly of the system.

20. The method of claim 18, wherein said testing occurs in field.

21. The method of claim 18, wherein energy for the indication comes from a battery on the motherboard.

* * * * *